United States Patent
Hind et al.

(10) Patent No.: US 6,635,088 B1
(45) Date of Patent: Oct. 21, 2003

(54) STRUCTURED DOCUMENT AND DOCUMENT TYPE DEFINITION COMPRESSION

(75) Inventors: John Raithel Hind, Raleigh, NC (US); David Bruce Lection, Raleigh, NC (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/197,299

(22) Filed: Nov. 20, 1998

(51) Int. Cl.[7] .............................................. G06F 7/00
(52) U.S. Cl. ....................................... 715/513; 707/101
(58) Field of Search ............................... 707/101, 501.1, 707/513

(56) References Cited

U.S. PATENT DOCUMENTS

| | | | | |
|---|---|---|---|---|
| 5,854,597 A | * | 12/1998 | Murashita et al. | 341/50 |
| 5,895,463 A | * | 4/1999 | Dowling et al. | 707/1 |
| 5,956,724 A | * | 9/1999 | Griffiths | 707/101 |
| 6,055,544 A | * | 4/2000 | DeRose et al. | 707/10 |
| 6,163,780 A | * | 12/2000 | Ross | 707/101 |
| 6,163,811 A | * | 12/2000 | Porter | 707/101 |
| 6,230,168 B1 | * | 5/2001 | Unger et al. | 715/501.1 |
| 6,259,912 B1 | * | 7/2001 | Si | 455/424 |
| 6,311,223 B1 | * | 10/2001 | Bodin et al. | 704/9 |
| 6,330,574 B1 | * | 12/2001 | Murashita | 707/101 |

* cited by examiner

*Primary Examiner*—Stephen S. Hong
*Assistant Examiner*—Cesar B Paula
(74) *Attorney, Agent, or Firm*—Jeanine S. Ray-Yarletts; Marcia L. Doubet

(57) ABSTRACT

A method, system, and computer-readable code for reducing Extensible Markup Language (XML) and Document Type Definition (DTD) document file size through one or more novel compression techniques. In one aspect, a compression technique for tags is defined that reduces the size of tags within either or both of XML and DTD files. In another aspect, a compression technique for attributes within tags may be used to further reduce file size (again, in either XML or DTD files). In a further aspect, a compression technique for strings within an XML file is defined, whereby the decompression will be performed automatically by an XML parser. While these compression techniques are described with reference to XML, they may also be used advantageously with other notations derived from SGML (Standard Generalized Markup Language).

9 Claims, 11 Drawing Sheets

```
750'  <!ENTITY A "1234 Cornwallis Drive, Research Triangle Park, NC 27709">

760'
       <A AA="Credit">    761'
         <B>13579</B>
705'—    <C AA="Preferred">24680</C>
         <D>Acme Widget</D>
         <E>&A;</E>
       </A>

770'
       <A AA="Cash">    771'
         <B>13580</B>
710'—    <C AA="Preferred">24680</C>
         <D>Acme Widget</D>
         <E>&A;</E>
       </A>
```

FIG. 3A

```
<Order>                                            ⎫
  <Order_Nbr>13579</Order_Nbr>          /306       ⎪
  <Customer_Nbr>24680</Customer_Nbr>                ⎬ 305
  <Customer_Name>Acme Widget</Customer_Name>       ⎪
  <Ship_To_Address>1234 Cornwallis Drive, Research Triangle Park, NC 27709</Ship_To_Address>   /307
</Order>                                           ⎭

<Order>                                            ⎫
  <Order_Nbr>13580</Order_Nbr>          /311       ⎪
  <Customer_Nbr>24680</Customer_Nbr>                ⎬ 310
  <Customer_Name>Acme Widget</Customer_Name>       ⎪
  <Ship_To_Address>1234 Cornwallis Drive, Research Triangle Park, NC 27709</Ship_To_Address>   /312
</Order>                                           ⎭
```

FIG. 3B

350 <!ENTITY A "1234 Cornwallis Drive, Research Triangle Park, NC 27709"> ←351, 352

305'
<Order>
  <Order_Nbr>13579</Order_Nbr>
  <Customer_Nbr>24680</Customer_Nbr>
  <Customer_Name>Acme Widget</Customer_Name>
  <Ship_To_Address>&A;</Ship_To_Address> ←360
</Order>

310'
<Order>
  <Order_Nbr>13580</Order_Nbr>
  <Customer_Nbr>24680</Customer_Nbr>
  <Customer_Name>Acme Widget</Customer_Name>
  <Ship_To_Address>&A;</Ship_To_Address> ←370
</Order>

FIG. 5A

550 <!ENTITY A "1234 Cornwallis Drive, Research Triangle Park, NC 27709">

505:
```
<Order>
  <Order_Nbr>13579</Order_Nbr>
  <Customer_Nbr>24680</Customer_Nbr>
  <Customer_Name>Acme Widget</Customer_Name>   561
  <Ship_To_Address>&A;</Ship_To_Address>       560
</Order>
```

510:
```
<Order>
  <Order_Nbr>13580</Order_Nbr>
  <Customer_Nbr>24680</Customer_Nbr>
  <Customer_Name>Acme Widget</Customer_Name>   571
  <Ship_To_Address>&A;</Ship_To_Address>       570
</Order>
```

FIG. 7A

```
750 <!ENTITY A "1234 Cornwallis Drive, Research Triangle Park, NC 27709">
     ╭ <Order Type="Credit">
     │     <Order_Nbr>13579</Order_Nbr>   /761
     │     <Customer_Nbr Type="Preferred">24680</Customer_Nbr>
705 ─┤     <Customer_Name>Acme Widget</Customer_Name>
     │     <Ship_To_Address>&A;</Ship_To_Address>
     ╰ </Order>
         /770
     ╭ <Order Type="Cash">
     │     <Order_Nbr>13580</Order_Nbr>   /771
     │     <Customer_Nbr Type="Preferred">24680</Customer_Nbr>
710 ─┤     <Customer_Name>Acme Widget</Customer_Name>
     │     <Ship_To_Address>&A;</Ship_To_Address>
     ╰ </Order>
```

STRUCTURED DOCUMENT AND DOCUMENT TYPE DEFINITION COMPRESSION

BACKGROUND OF THE INVENTION

1. Field of the Invention

The present invention relates to a computer system, and deals more particularly with a method, system, and computer-readable code for reducing the size of documents (such as XML and DTD documents) through novel compression techniques.

2. Description of the Related Art

Extensible Markup Language, or "XML", is a standardized formatting notation, created for structured document interchange on the World Wide Web (hereinafter, "Web"). XML is a tag language, where specially-designated constructs referred to as "tags" are used to delimit (or "mark up") information. In the general case, a tag is a keyword that identifies what the data is which is associated with the tag, and is typically composed of a character string enclosed in special characters. "Special characters" means characters other than letters and numbers, which are defined and reserved for use with tags. Special characters are used so that a parser processing the data stream will recognize that this a tag. A tag is normally inserted preceding its associated data: a corresponding tag may also be inserted following the data, to clearly identify where that data ends. As an example of using tags, the syntax "<email>" could be used as a tag to indicate that the character string appearing in the data stream after this tag is to treated as an e-mail address; the syntax "</email>" would then be inserted after the character string, to delimit where the e-mail character string ends.

The syntax of XML is extensible because it provides users the capability to define their own tags. XML is based on SGML (Standard Generalized Markup Language), which is an international standard for specifying document structure. SGML provides for a platform-independent specification of document content and formatting. XML is a simplified version of SGML, tailored to Web document content. (Refer to ISO 8879, "Standard Generalized Markup Language (SGML)", (1986) for more information on SGML, and to "Extensible Markup Language (XML), W3C Recommendation Feb. 10, 1998" which is available on the World Wide Web at http://www.w3.org/TR/1998/REC-xml-19980210, for more information on XML.)

XML is widely accepted in the computer industry for defining the semantics (that is, by specifying meaningful tags) and content of the data encoded in a file. The extensible, user-defined tags enable the user to easily define a data model, which may change from one file to another. When an application generates the tags (and corresponding data) for a file according to a particular data model and transmits that file to another application that also understands this data model, the XML notation functions as a conduit, enabling a smooth transfer of information from one application to the other. By parsing the tags of the data model from the received file, the receiving application can re-create the information for display, printing, or other processing, as the generating application intended it.

A Document Type Definition, or "DTD", may be used with an XML file. In general, a DTD is a definition of the structure of an SGML document, and is written using SGML syntax. The DTD is encoded in a file which is intended to be processed, along with the file containing a particular document, by an SGML parser. The DTD tells the parser how to interpret the document which was created according to that DTD. DTDs are not limited to use with XML, and may in fact be used to describe any document type. For example, suppose a DTD has been created for documents of type "memo". Memos typically contain "To" and "From" information. The DTD would contain definitional elements for these items, telling the parser what to do when it encounters "To" and "From" in an actual memo (such as using bold text for printing or displaying the words "To" and "From", left-justifying the lines on which they appear, etc). The HyperText Markup Language, or "HTML", is a popular example of a notation defined using an SGML DTD. HTML is used for specifying the content and formatting of Web pages, where "Web browser" software processes the HTML definition along with a Web page in the same manner an SGML parser is used for other DTDs and document types. When used with XML, a DTD specifies how the tags defined for this particular document type are to be inserted into the XML data stream when the XML file is being created. When a user wishes to print or display a document encoded according to this DTD, the software (i.e. the parser, compiler or other application) uses the DTD file to determine how to process the contents of the XML document file.

Because the XML tags are defined by humans, and intended to be human-readable as well as machine-processable, they may become quite long in terms of character length. Each opening tag requires a matching closing (or "end") tag, so that the number of characters required to express a given tag effectively doubles. As an example of tag that may be defined, suppose a user wishes to represent names and addresses in a file. The tags used to delimit the name may be simply "<name>" and "</name>", where the angle brackets are the SGML (and XML) syntax designated as bracketing a tag, and the combination of the "/" symbol with an opening angle bracket further designates that this is the end tag. Alternatively, longer tags could be used such as "<customer_name>" and "</customer_name>", or separate tags could be used to separate the first name, middle initial, and last name when the name was associated with a person. The longer the tag, the more descriptive it will tend to be. For example, if the data model includes not only one person's name, but perhaps a spouse name and children's names, or an employer's name, then more characters will need to be used in the tags (such as "<employee_name>" and "<company_name>") to enable a human reader to understand which name is which. The value to be used for the information represented by a tag is then encoded between the opening and closing tag. For example, suppose a company name is "Acme Widget". According to this example, the string "<company_name>Acme Widget</company_name>" would be used to encode this information in a document. The document could contain many other company names, which would be similarly encoded. Other document types which do not use company names simply define different tags, for the information that is pertinent to those document types.

There is one exception to the requirement for matching end tags for each opening tag. It may be that there is no value for the tag in a particular usage. Suppose, for example, that the person from the data model discussed above has no spouse. In that situation, no value appears between the tags where the spouse name would otherwise be located. A short-hand specification technique has been defined for this null-value case, where a "/" character is inserted into the opening tag preceding the ">" character. If "<spouse>" and </spouse>" are the tags used for bracketing the spouse string in this model, then the shorthand representation takes the form "<spouse/>".

The longer the length of the tags in the file, the larger the file becomes. While file size may not be an issue in some computing environments, such as where a server in a network has access to banks of storage devices, there are many situations where file size can become a critical factor in operating a computer. When the file is to be received at a constrained-storage device such as a handheld computer, Personal Digital Assistant ("PDA"), or other pervasive computing device, the larger the size of the file, the more likely it is that problems will arise when trying to store it at the receiver. And, the larger the file, the longer it will take to transmit the file between computers. The popularity of using portable computers such as handheld devices for connecting to the Internet, or other networks of computers, is increasing as user interest in computing becomes pervasive and users are more often working in mobile environments. At the same time, the popularity of making network connections using connection services that charge fees based upon the duration of connections (such as cellular services, which are commonly used for wireless connections from portable computers) is also growing. When using this type of relatively expensive connection, the longer the user must wait to receive a file, the higher his connection charges will be.

These factors illustrate the importance of minimizing the size of files being transmitted and stored. Efforts to compress XML files using binary compression algorithms are underway. This type of compression is similar to the commonly-known techniques with which "zip" files are created to reduce file size. A widely used program for compressing files into zip format is known as "PKZIP", developed by PKware, Inc. A companion program, "PKUNZIP", is required to decompress the zipped file back into a usable form. In a similar manner, binary compression of XML files will require that a decompression program is installed and running on a machine that receives compressed XML and wishes to process the original XML contents. If the receiving machine is storage-constrained, storing an XML decompression program on the machine will result in less storage available for the user's data files and other applications. Further, the compressed XML file will be unreadable (and therefore unusable) on any machine which does not have the decompression software, thereby limiting the transportability of the XML files in contradiction to one of the original goals of the XML notation. Thus, if compression is implemented in a manner that requires complementary decompression software, care must be taken to ensure that the decompression software is available at the receiver, and that the software is as compact as possible.

Accordingly, a need exists for a technique with which files encoded according to an SGML derivative notation can be compressed, thereby removing the negative aspects of storing and transmitting large file size discussed above. The proposed technique provides a novel way to reduce the size of XML files for transmission and storage, and a novel way to reduce the size of DTD files as well. In one aspect, this compression is achieved in a manner that does not require special decompression software to decompress the files when the user requests to process them.

SUMMARY OF THE INVENTION

An object of the present invention is to provide a technique whereby XML files can be compressed, reducing the file size for storage and transfer.

Another object of the present invention is to provide a technique whereby DTD files can be compressed, reducing their file size for storage and transfer.

Still another object of the present invention is to provide a technique whereby XML file size is reduced by compressing strings.

It is another object of the present invention to provide this XML string compression in a manner that does not require special decompression software to decompress the files for processing.

A further object of the present invention is to provide a technique whereby XML and/or DTD file size is reduced by compressing tags.

Yet another object of the present invention is to provide a technique whereby XML and/or DTD file size is reduced by compressing attributes within tags.

Other objects and advantages of the present invention will be set forth in part in the description and in the drawings which follow and, in part, will be obvious from the description or may be learned by practice of the invention.

To achieve the foregoing objects, and in accordance with the purpose of the invention as broadly described herein, the present invention provides a software-implemented process for use in a computing environment for reducing document file size by tag compression, comprising: an input file encoded in a derivative of Standard Generalized Markup Language (SGML); a subprocess for reading the encoded file; a subprocess for locating each of a plurality of tags in the encoded file; a subprocess for substituting a unique short tag for each unique one of the located tags in the encoded file; and a subprocess for storing a correspondence between each of the short tags and the located tag for which it was substituted. Preferably, the derivative is Extensible Markup Language (XML). Further, a subprocess for decompressing a compressed file resulting from the subprocess for substitution may be used, comprising: a subprocess for reading the compressed file; a subprocess for locating each of the substituted short tags in the compressed file; a subprocess for reading the stored correspondence between short tags and located tags, retrieving the stored located tag corresponding to the located substituted short tag; and a subprocess for substituting the retrieved tag for the located substituted short tag in the compressed file.

The present invention also provides a software-implemented process for reducing document file size by tag attribute compression, comprising: an input file encoded in a derivative of Standard Generalized Markup Language (SGML); a subprocess for reading the encoded file; a subprocess for locating each of a plurality of tag attributes in the encoded file; a subprocess for substituting a unique short tag for each unique one of the located tag attributes in the encoded file; and a subprocess for storing a correspondence between each of the short tags and the located tag attribute for which it was substituted. Preferably, the derivative is Extensible Markup Language (XML). Further, a subprocess for decompressing a compressed file resulting from the subprocess for substitution may be used, comprising: a subprocess for reading the compressed file; a subprocess for locating each of the substituted short tags in the compressed file; a subprocess for reading the stored correspondence between short tags and located tags, retrieving the stored located tag corresponding to the located substituted short tag; and a subprocess for substituting the retrieved tag for the located substituted short tag in the compressed file.

The present invention also provides a software-implemented process for reducing document file size by string compression, comprising: an input file encoded in a derivative of Standard Generalized Markup Language (SGML); a subprocess for reading the encoded file; a subprocess for locating each of a plurality of strings in the encoded file; a subprocess for substituting a unique entity name reference for each unique one of the located strings in the encoded file, provided that a first cost of substituting the located string is less than a second cost of using the located string without substitution, and provided that the located string contains no embedded entity references; and a subprocess for creating an entity declaration for each of the unique entity name references. Preferably, the derivative is Extensible Markup Language (XML). Further, a subprocess for decompressing a compressed file resulting from the subprocess for substitution may be used, comprising using a standard parser for the derivative.

The present invention will now be described with reference to the following drawings, in which like reference numbers denote the same element throughout.

BRIEF DESCRIPTION OF THE DRAWINGS

FIGS. 3A–3B illustrate a simple example of a fragment from a document file, before and after applying the string compression technique of the present invention;

FIGS. 5A–5B illustrate a simple example of a fragment from a document file, before and after applying the tag compression technique of the present invention;

FIGS. 7A–7B illustrate a simple example of a fragment from a document file, before and after applying the tag attribute compression technique of the present invention;

DESCRIPTION OF THE PREFERRED EMBODIMENT

Figure 1:
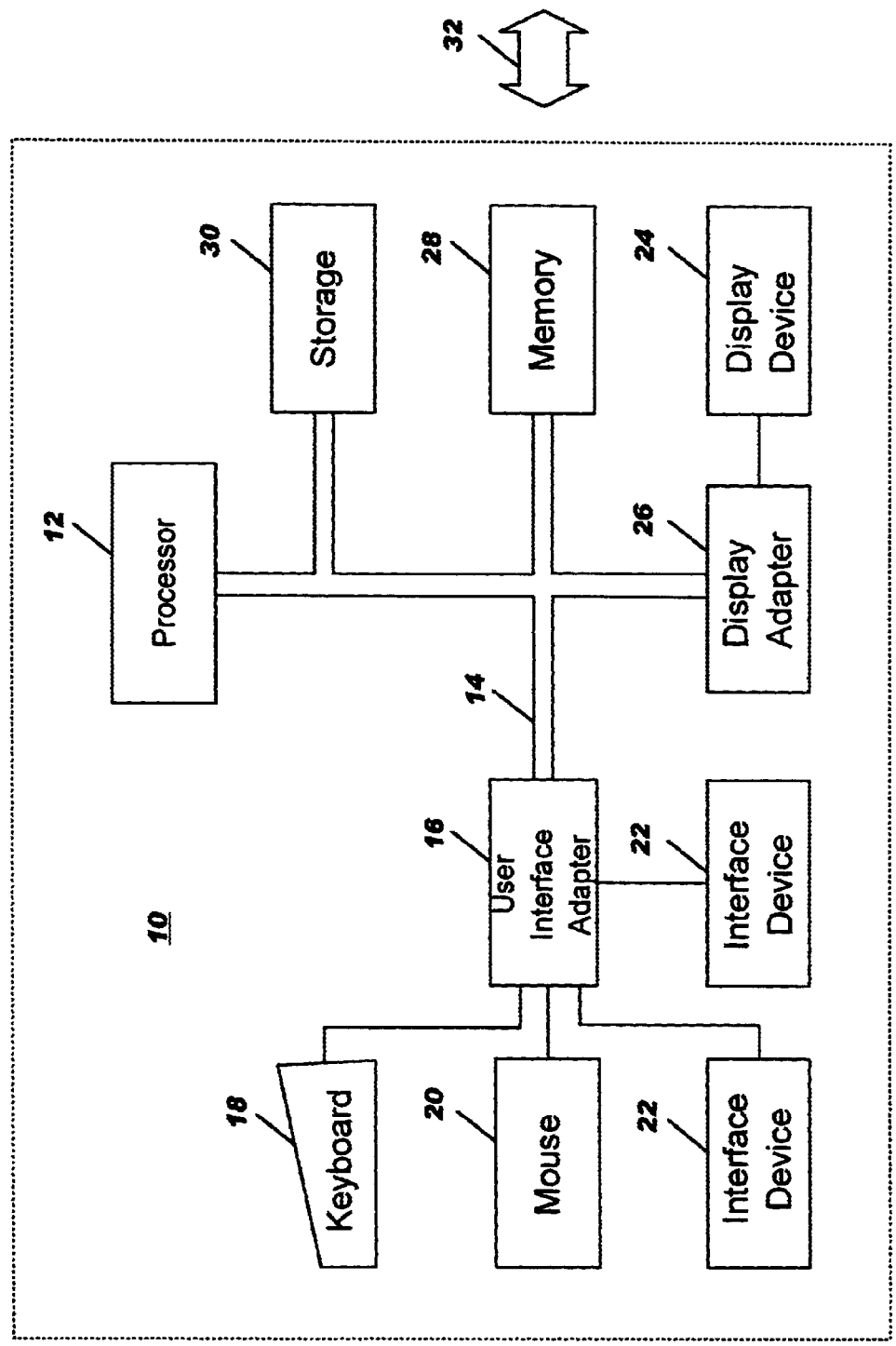
FIG. 1 is a block diagram of a computer workstation environment in which the present invention may be practiced.

FIG. 1 illustrates a representative workstation hardware environment in which the present invention may be practiced. The environment of FIG. 1 comprises a representative single user computer workstation 10, such as a personal computer, including related peripheral devices. The workstation 10 includes a microprocessor 12 and a bus 14 employed to connect and enable communication between the microprocessor 12 and the components of the workstation 10 in accordance with known techniques. The workstation 10 typically includes a user interface adapter 16, which connects the microprocessor 12 via the bus 14 to one or more interface devices, such as a keyboard 18, mouse 20, and/or other interface devices 22, which can be any user interface device, such as a touch sensitive screen, digitized entry pad, etc. The bus 14 also connects a display device 24, such as an LCD screen or monitor, to the microprocessor 12 via a display adapter 26. The bus 14 also connects the microprocessor 12 to memory 28 and long-term storage 30 which can include a hard drive, diskette drive, tape drive, etc.

The workstation 10 may communicate with other computers or networks of computers, for example via a communications channel or modem 32. Alternatively, the workstation 10 may communicate using a wireless interface at 32, such as a CDPD (cellular digital packet data) card. The workstation 10 may be associated with such other computers in a local area network (LAN) or a wide area network (WAN), or the workstation 10 can be a client in a client/server arrangement with another computer, etc. All of these configurations, as well as the appropriate communications hardware and software, are known in the art.

Figure 2:
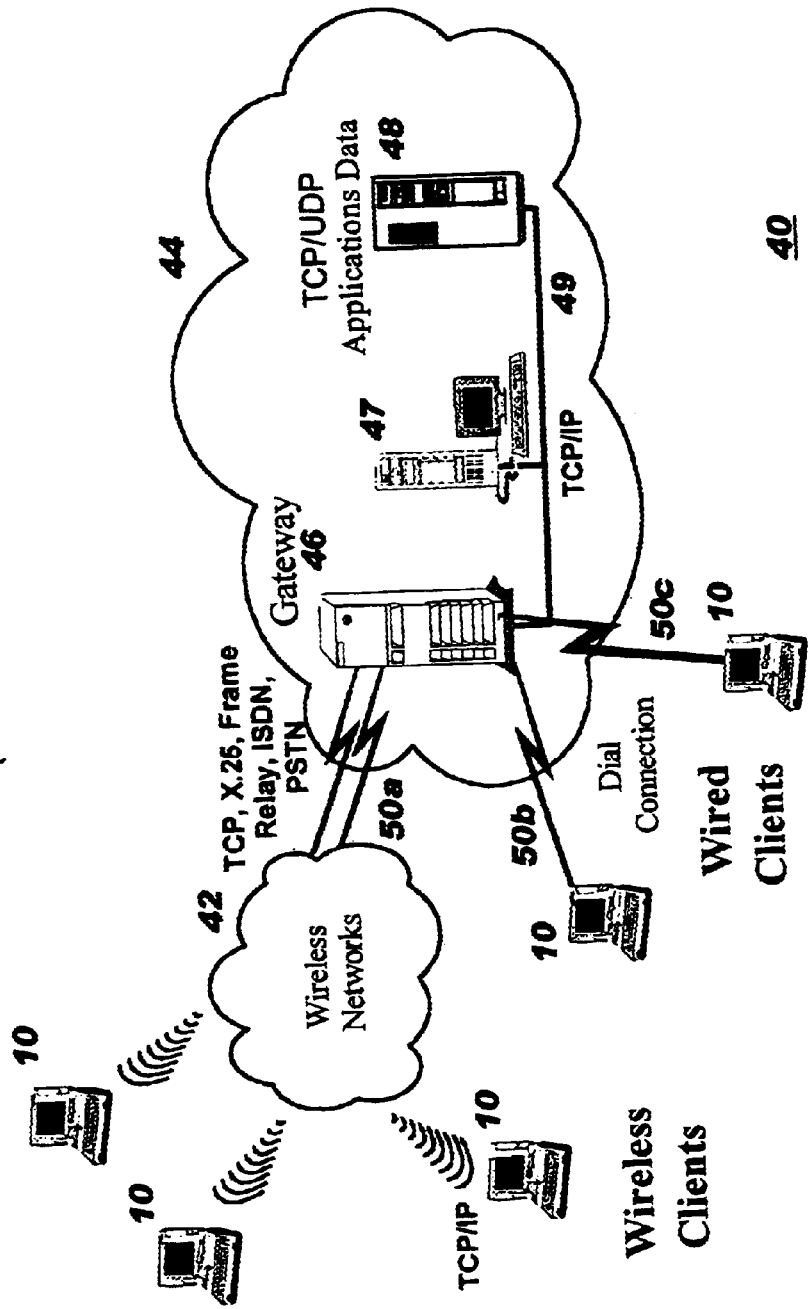
FIG. 2 is a diagram of a networked computing environment in which the present invention may be practiced.

FIG. 2 illustrates a data processing network 40 in which the present invention may be practiced. The data processing network 40 may include a plurality of individual networks, such as wireless network 42 and network 44, each of which may include a plurality of individual workstations 10. Additionally, as those skilled in the art will appreciate, one or more LANs may be included (not shown), where a LAN may comprise a plurality of intelligent workstations coupled to a host processor.

Still referring to FIG. 2, the networks 42 and 44 may also include mainframe computers or servers, such as a gateway computer 46 or application server 47 (which may access a data repository 48). A gateway computer 46 serves as a point of entry into each network 44. The gateway 46 may be preferably coupled to another network 42 by means of a communications link 50a. The gateway 46 may also be directly coupled to one or more workstations 10 using a communications link 50b, 50c. The gateway computer 46 may be implemented utilizing an Enterprise Systems Architecture/370 available from the International Business Machines Corporation ("IBM"), an Enterprise Systems Architecture/390 computer, etc. Depending on the application, a midrange computer, such as an Application System/400 (also known as an AS/400) may be employed. ("Enterprise Systems Architecture/370" is a trademark of IBM; "Enterprise Systems Architecture/390", "Application System/400", and "AS/400" are registered trademarks of IBM.)

The gateway computer 46 may also be coupled 49 to a storage device (such as data repository 48). Further, the gateway 46 may be directly or indirectly coupled to one or more workstations 10.

Those skilled in the art will appreciate that the gateway computer 46 may be located a great geographic distance from the network 42, and similarly, the workstations 10 may be located a substantial distance from the networks 42 and 44. For example, the network 42 may be located in California, while the gateway 46 may be located in Texas, and one or more of the workstations 10 may be located in New York. The workstations 10 may connect to the wireless network 42 using a networking protocol such as the Transmission Control Protocol/Internet Protocol ("TCP/IP") over a number of alternative connection media, such as cellular phone, radio frequency networks, satellite networks, etc. The wireless network 42 preferably connects to the gateway 46 using a network connection 50a such as TCP or UDP (User Datagram Protocol) over IP, X.25, Frame Relay, ISDN (Integrated Services Digital Network), PSTN (Public Switched Telephone Network), etc. The workstations 10 may alternatively connect directly to the gateway 46 using dial connections 50b or 50c. Further, the wireless network 42 and network 44 may connect to one or more other networks (not shown), in an analogous manner to that depicted in FIG. 2.

Software programming code which embodies the present invention is typically accessed by the microprocessor 12 of the workstation 10 and server 47 from long-term storage media 30 of some type, such as a CD-ROM drive or hard drive. The software programming code may be embodied on any of a variety of known media for use with a data processing system, such as a diskette, hard drive, or CD-ROM. The code may be distributed on such media, or may be distributed to users from the memory or storage of one computer system over a network of some type to other computer systems for use by users of such other systems. Alternatively, the programming code may be embodied in the memory 28, and accessed by the microprocessor 12 using the bus 14. The techniques and methods for embodying software programming code in memory, on physical media, and/or distributing software code via networks are well known and will not be further discussed herein.

A user of the present invention may connect his computer to a server using a wireline connection, or a wireless connection. Wireline connections are those that use physical media such as cables and telephone lines, whereas wireless connections use media such as satellite links, radio frequency waves, and infrared waves. Many connection techniques can be used with these various media, such as: using the computer's modem to establish a connection over a telephone line; using a LAN card such as Token Ring or Ethernet; using a cellular modem to establish a wireless connection; etc. The user's computer may be any type of computer processor, including laptop, handheld or mobile computers; vehicle-mounted devices; desktop computers; mainframe computers; etc., having processing (and optionally communication) capabilities. The remote server, similarly, can be one of any number of different types of computer which have processing and communication capabilities. These techniques are well known in the art, and the hardware devices and software which enable their use are readily available. Hereinafter, the user's computer will be referred to equivalently as a "workstation", "device", or "computer", and use of any of these terms or the term "server" refers to any of the types of computing devices described above.

In the preferred embodiment, the present invention is implemented as one or more computer software programs. The implementation of the software that compresses XML and/or DTD files may operate on a server in a network, as one or more modules (also referred to as code subroutines, or "objects" in object-oriented programming) which are invoked upon request. Alternatively, the compression software may operate on a user's workstation. The logic implementing this file compression may be integrated with the code of a program which creates the XML or DTD files, or it may be implemented as one or more separate utility modules, which provide compression that is performed after the XML or DTD file has been created, without deviating from the inventive concepts disclosed herein. Similarly, the file decompression software (where applicable, as discussed in detail below) may operate on a server, or on a user's workstation, and this software may be provided in one or more separate utility modules that are invoked to decompress the file content before using it in an application, or it may be integrated into an application that processes the files. The server may be functioning as a Web server, where that Web server provides services in response to requests from a client connected through the Internet. Alternatively, the server may be in a corporate intranet or extranet of which the client's workstation is a component, or in any other network environment. While the preferred embodiment anticipates that the compressed files are sent over a network connection, the file content may also be transferred between computers via a storage media (such as diskette), without deviating from the inventive concepts disclosed herein.

While the preferred embodiment of the present invention contemplates that the file compression logic is implemented in a different program from that implementing the file decompression logic, the two different logic functions may alternatively be implemented in a single program without deviating from the scope of the present invention.

Note that the word "file" is used throughout this disclosure to refer to stored data. This is for ease of reference only, and is not meant to imply any particular structure for storing the data, such as conventional "flat files". The data with which the present invention may be beneficially used may be stored in any number of ways without deviating from the inventive concepts disclosed herein, such as: a data element in a database, an object attribute in a directory entry, an object in flash memory, etc.

The preferred embodiment of the present invention will now be discussed in more detail with reference to FIGS. 3 through 7.

Three aspects of the present invention will now be described. Each aspect provides an independent technique for reducing file size by compression. The techniques may each be used separately, or they may used in any combination.

In a first aspect, strings occurring within a document file are compressed. The novel technique with which this is accomplished is particularly advantageous when the compressed files will be processed by a constrained-storage device. An example of this type of device is the IBM WorkPad, which is a handheld computer typically configured with several megabytes of storage, where that storage is provided as Random Access Memory ("RAM") to avoid the system overhead associated with other types of storage such as disk drives. ("WorkPad" is a registered trademark of IBM.) In this first aspect, the manner in which file compression is implemented does not require special file decompression software to be used on the receiving (decompressing) computer. This allows conservation of the constrained storage, increasing the amount of storage available for files and other applications. This approach also increases the transportability of the compressed files, which can be decompressed on any machine that could have processed the original uncompressed file.

This first aspect takes advantage of a feature of XML parsers, and the manner in which such parsers are designed to process "entities" within a file. An entity is "a collection of characters that can be referenced as a unit", according to the SGML standard. An entity is encoded using a special XML construct, and is used to substitute a text string or a file into a document. For purposes of the present invention, the pertinent substitution is the text string mechanism. Note that this same construct is defined in SGML, and would therefore likely be available in any notation derived from SGML. Accordingly, while the technique of this first aspect is described in terms of a file encoded in the XML notation, it may also be used advantageously with a file encoded according to any other tag syntax where a processing tool such as the XML parser performs the type of textual substitution for entity declarations that will now be described.

The entity declaration syntax is:

<!ENTITY entity_name "the text string for the entity"> where the symbol "<!ENTITY" is a keyword string that identifies what follows as being an entity declaration. The name for this entity is specified where the "entity_name" parameter occurs, and the text to be substituted then follows within quotation marks. All entity declarations must appear at the beginning of a file encoded according to XML syntax. Within the body of the encoded document file, the entity name is used by preceding it with an ampersand character, and following it with a semicolon. This will be referred to herein as an "entity reference". When the XML parsing process for a document file begins, the parser reads each entity declaration in sequence, and then substitutes the character string that was specified within the quotation marks for each occurrence of that entity reference. This substitution process for entities occurs in the XML parsers of the prior art. This first aspect of the present invention makes advantageous use of this substitution process to reduce file size, as will now be described in more detail.

By reviewing the entity declaration syntax shown above, it can be seen that at least 18 characters are required to specify the entity declaration, and to refer to it once within the file. This minimum length is for an entity name one character in length, where a one-character substitution string is specified in the declaration. Fifteen of these 18 characters are required for the minimal-length declaration, and the remaining 3 are required for one reference to the entity within the file. This is shown in the following example, where it should be noted that the spaces appearing in the declaration before and after the letter "A" are each counted as one character:

entity declaration: <!ENTITY A "B"> entity reference: &A;

This example declares an entity named "A", and substitution text containing the single character "B". Thus, when the symbol "&A;" is detected in the file by the parser, the character "B" will be automatically inserted in its place. According to the present invention, an entity declaration will be created for the strings that appear in a document file being compressed, replacing the strings with a shorter entity reference, thereby compressing the amount of space required for the string. The decompression is then performed by the XML parser, using mechanisms already in place as stated above, so that no extra decompression code is required.

According to the preferred embodiment of the string compression technique disclosed herein, two exception cases are defined where string substitution does not occur. First, entities are not declared for any strings where the number of characters required to specify the entity declaration and references would be greater than the number of characters used to represent the strings themselves, since to do otherwise would actually increase the file size. Suppose, for example, that a text string containing 50 characters occurred once in a document file. Obviously, in uncompressed form, 50 characters are used to represent this string in the file. If an entity declaration were created, the 50-character string would appear as the part of the declaration within quotations, so that the additional characters used for the entity declaration syntax would again increase the file size instead of reducing it. Second, entity declarations will not be created for strings that contain embedded entity references. This is because existing XML parsers do not provide for substitution of an entity within an entity, so that the decompression process would not work properly.

FIGS. 3A–3B illustrate an example of a fragment from a document file for which this string compression may be used beneficially. In FIG. 3A, the compression has not yet been performed. This example 300 shows a hypothetical document structure for customer orders. As seen at 305 and 310, two separate orders are encoded, each having a different order number 306, 311. The text string encoded in the "Ship_To_Address" tag is the same in each order (see 307, 312), and contains 46 characters. Thus, the 2 occurrences of this string occupy 92 character positions (and 92 bytes of the encoded file). FIG. 3B shows this same information, after the compression technique of this first aspect of the present invention has been applied to the document file. An entity declaration 350 has been created, where a short entity name of "A" 351 has been declared as representing the text string 352 which occurred at 307 and 312 of FIG. 3A. This entity is then referenced twice in the file, at 360 and 370. The entity declaration 350 contains 60 characters, and each reference 360, 370 contains 3 characters, for a total of 66 characters. Thus, the compression of this string has reduced the file size by (92−66)=26 bytes. It will be obvious to one of ordinary skill in the art that much greater savings can be achieved in larger files, where a string may appear many more times than the two occurrences of this simple example.

Note that when the entity references generated by the present invention are inserted in place of a string, no additional leading or trailing blanks are inserted to surround the entity reference. The figures used to show examples of this technique are intended to convey this fact. In FIG. 3B, for example, the entity references shown at 360 and 370 are 3 characters in length, and are not separated from the neighboring tag syntax with blanks.

Figure 4A:
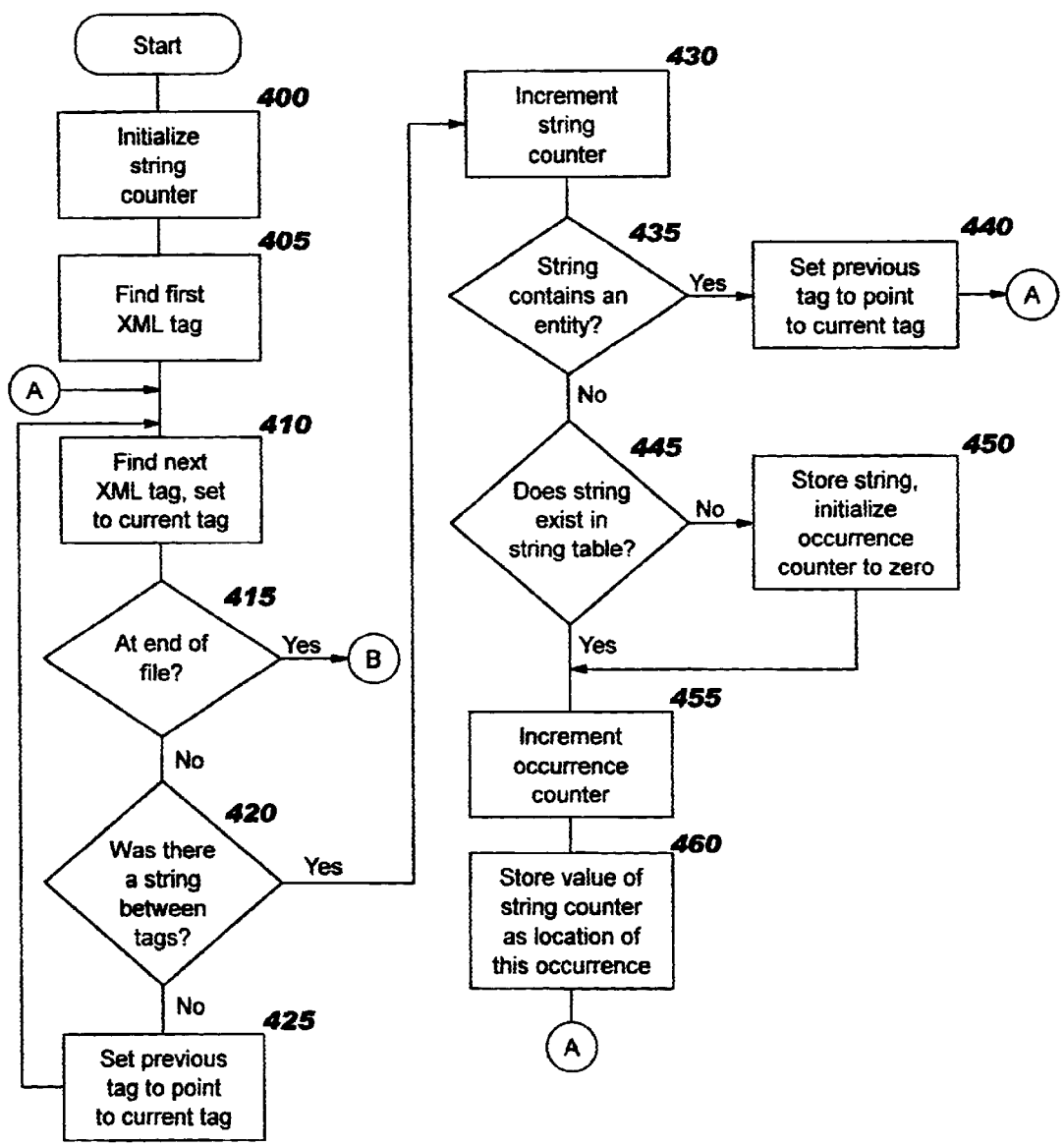
FIG. 4 (comprising FIGS. 4A and 4B) illustrates a flow chart which sets forth the logic involved with a first aspect of the present invention.
Figure 4B:
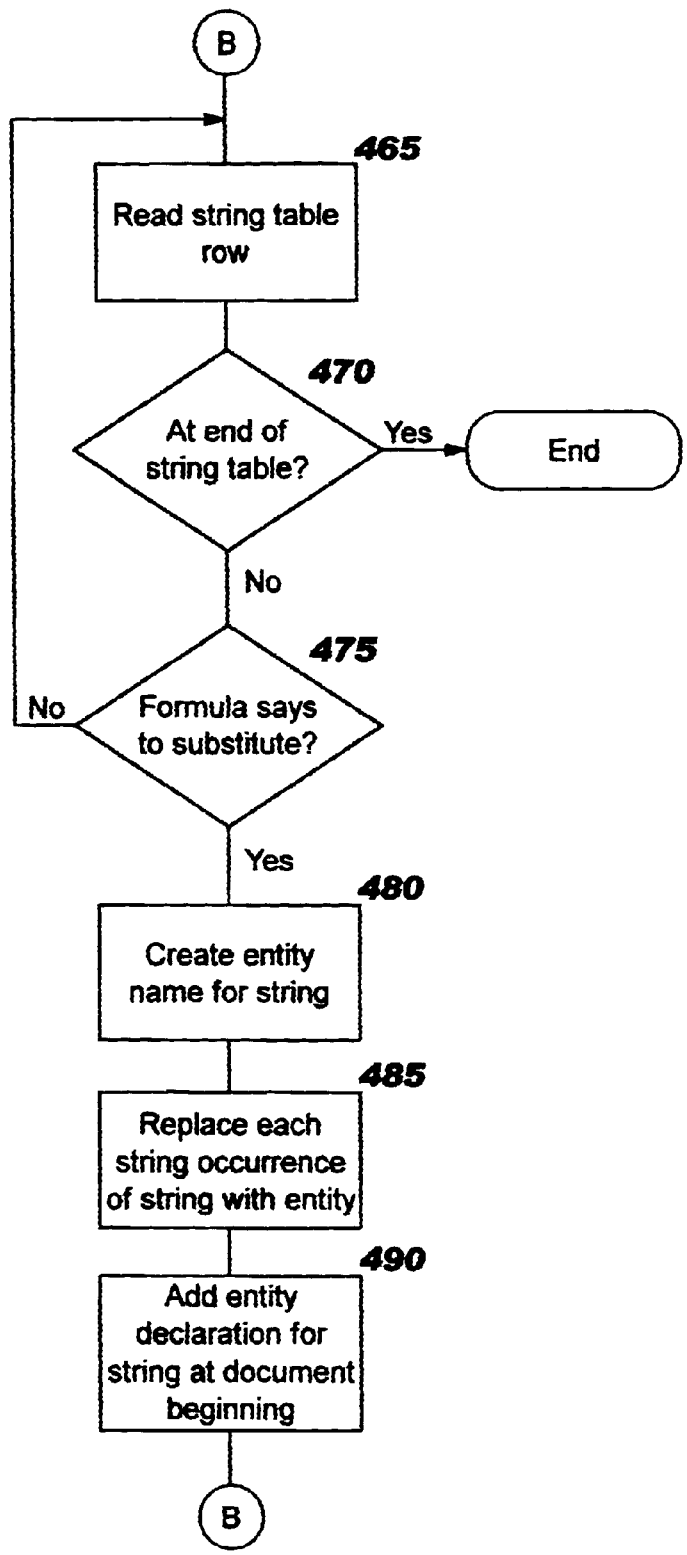

FIGS. 4A and 4B illustrate a flowchart of the logic that may be used to implement this aspect of the present invention, which takes into account the two exception cases described above. The process begins at Block 400 of FIG. 4A, where a counter is initialized to zero. This counter will be used to count the strings in the input file, as if the file was an array of strings, for later processing during the substitution of entity references. At Block 405, the first tag in the input document file is read. This tag will be treated as the value of the variable "previous tag". (Techniques for locating each data item within a file, such as the tags, are well known and will not be described in detail herein.) At Block 410, the next tag in the file is read, and the "current tag" variable is set to point to this next tag.

A test is made at Block 415 to determine whether the read operation in Block 410 caused the end of the input file to be reached (i.e. there was no "next tag" located by Block 410). When Block 415 has a positive result, control transfers to Block 465. Otherwise, a further test is made at Block 420 to determine if there was a string in between the two tags pointed to by "previous tag" and "current tag". If there was, then control transfers to Block 430; otherwise, Block 425 sets the value that was stored in "current tag" to be stored in "previous tag", and control returns to Block 410 to get the next tag.

When control reaches Block 430, a string has been located in the input file. Thus, Block 430 increments the string counter. Block 435 checks to see if the string contains an embedded entity reference. When there is an entity reference, the second exception case is handled by transferring control to Block 440 (and therefore skipping over this string). Otherwise, processing continues to Block 445.

At Block 440, the current string is being skipped over, so that no entity declaration will be created for it. The value in the variable "previous tag" is set to the value that is in the variable "current tag", and control returns to Block 410 to get the next tag from the input file.

When control reaches Block 445, there is a string for which an entity declaration may be created (i.e. if the first exception case, which is checked in FIG. 4B, is also met). Block 445 asks whether an entry in a table of strings has already been created for this string. If not, then Block 450 creates the entry in the table, and initializes its occurrence counter to zero. When control reaches Block 455, an entry already existed in the table, or has just been created. Block 455 increments the occurrence counter for this table entry. The value of the string counter is then stored with this table entry at Block 460, to remember where in the array of strings this string has been found. Control returns to Block 410 to read the next tag.

Block 465 is reached when the input file has been completely read, all the strings have been located, and those strings meeting the second exception condition have been entered into the string table. The remaining logic of FIG. 4B processes this string table, using it to perform the substitution of entities for strings within the input file.

Block 465 reads an entry from the string table, and Block 470 checks to see if the end of the table has been reached. If so, then the compressed file has been created, and the processing of FIG. 4 ends.

When the end of the string table has not been reached, Block 475 computes a formula that determines whether the fist exception case is met, ensuring that the replacement cost of using entity substitution is less than the cost of keeping the original strings. That formula is:

$$(S*N) > (E+2)*N) + (13+S+E)$$

where N=number of occurrences of string
E=size of entity definition string
S=size of original string
In this formula, the sum of (13+S+E) represents the entity declaration, where 13 characters are required for the declaration, excluding the length of the original string "S" and the length of the entity "E" being substituted for it. The result of ((E+2) * N) represents the total length of all the entity references, where 2 is added to the length of the substituted reference text to account for the ampersand and semicolon characters. When this formula evaluates to true, Block 475 has a positive response and control will transfer to Block 480 to complete the process of replacing this string by an entity. Otherwise, the replacement cost for using an entity is too high, so control transfers back to Block 465, skipping the replacement process for this string.

Block 480 creates an entity name for this string, and Block 485 uses the stored string counter values (stored at Block 460, above) to locate the occurrences of the string in the input file and replace those occurrences with an entity reference for this newly-created entity name. Entity references, as depicted at 360 and 370 of the example in FIG. 3B, are formed by preceding the entity name with an ampersand and following it with a semi-colon. Finally, Block 490 adds an entity declaration to the beginning of the compressed file, having the syntax as shown at 350 of the example in FIG. 3B, where the entity name is generated according to an algorithm (discussed below) and the text to be substituted is the original string that is stored in this row of the string table. Control then returns to Block 465, to process the next string from the string table.

According to the preferred embodiment, a simple entity name generation approach is used that will minimize the length of the entity names (thus conserving as much space as possible as a result of this compression process). Any number of techniques may be used to construct short entity names. Preferably, the letters of the alphabet will be used in succession, so that the first entity name is "A", the next is "B", and so on. Once 26 entity names have been created, if more are needed, then 2-character entity names will be used.

These 2-character names are preferably constructed by appending the characters of the alphabet in sequence, so that the 27th name will be "AA", the 28th will be "AB", the 53rd will be "BA", and so forth. With this approach, the total number of entity names that can be handled with no more than 2 characters is (26+(26*26)). For the general case where entity names are assigned by starting with a single character, then using two characters when the single character names are exhausted, and using three-character names after that, etc., up through entity names of length "N", the total number of entity names that can be generated is represented by the expression ((26 N)+(26 (N−1))+. . . +(26 ** 2)+26).

The file which has been compressed according to FIG. 4 can now be transferred between computers and/or stored in its compressed format. When the time comes to display or otherwise process the file, it will be automatically decompressed as part of the XML parsing process, as has been stated.

In an optional enhancement of this aspect of the invention, the approach which has been described above for substituting entities for strings between tags may also be applied to strings that occur as values of attributes. It will be obvious to one of ordinary skill in the art how to modify the logic of FIGS. 4A and 4B to provide this additional feature.

In yet another optional enhancement of this aspect, string compression may be performed for strings containing entity references. This alters the processing of Block 440 in FIG. 4A. Instead of slipping over any strings that contain entity references, such strings will now be parsed into "stringlets". A stringlet is itself a string, but specifically refers to each substring occurring between two tags and separated by an entity reference. For example, if a string "string with &E; entity reference" was detected, the first stringlet would be the substring "string with" and the second stringlet would be the substring "entity reference". A substring counter would also be added to the processing of FIG. 4 (specifically, to Blocks 460 and 485, with additional logic that initializes the substring counter each time a substring processing operation begins in revised Block 440), to keep track of which substring within a located string corresponds to which stored text. Block 475 would apply the replacement cost formula to the substrings, in the same manner that replacement cost for strings is computed (described above).

In a second aspect, the tags within a file are compressed. This tag compression may be applied to the XML document file, to the DTD file used with the document file, or to both files. (While this aspect is described in terms of document files encoded in XML, it may also be used advantageously with document files encoded in other notations derived from SGML, including SGML itself.) As stated previously, tags are typically created to be descriptive and human-readable, which tends to make the tags long. Because the tags do not need to be descriptive nor human-readable when the file is merely being stored or transferred between computers, compressing the tags into something less descriptive does not impact the usability of the information represented in the file. This compression technique does require complementary decompression processing to be applied to the compressed file before it can be used, however.

In this second aspect, no predefined language constructs are used to represent the tag contents, so that the tag compression process will be applied to all tags with neither of the exception cases that were used in the first aspect.

Figure 5B:
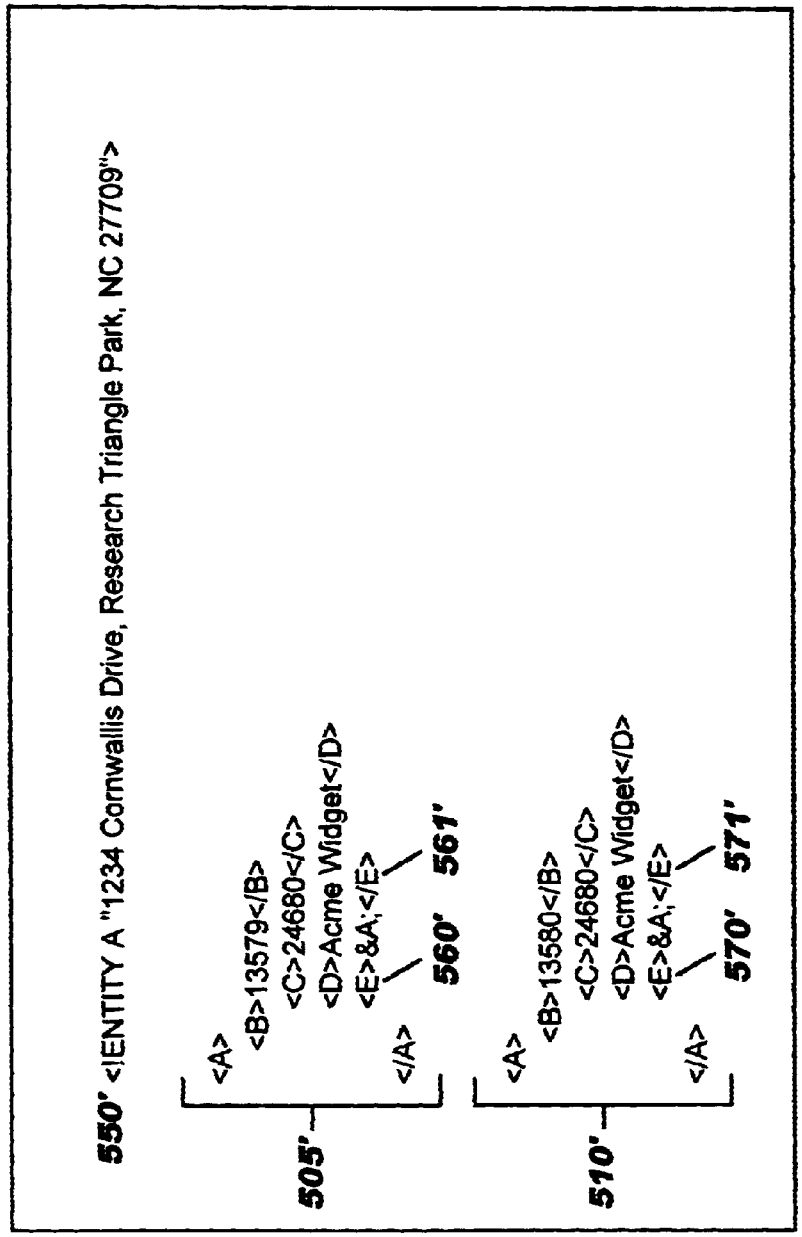

FIGS. 5A–5B illustrate an example of a fragment from a document file for which this tag compression may be used beneficially. Note that these figures contain the same hypothetical customer orders example that was used in FIG. 3, and represent the document content as if the string compression of the first aspect had been performed (see 550 of FIG. 5A, for example). This is to illustrate that the compression techniques of the various aspects may be used in combination, although as stated previously, the techniques are independent and may be used separately. In FIG. 5A, the tag compression has not yet been performed. In the order at 505, one of the tags is the 15-character tag "Ship_To_ Address", with the opening tag at 560 and the closing tag at 561. This tag also appears in the second order 510, at 570 and 571. FIG. 5B shows the file after the tag compression process of this second aspect has completed. The 15-character tag has now been replaced by a single character tag, as shown at 560' and 561' in the first order 505', and 570' and 571' of the second order 510'. The other tags of the file have also been compressed in FIG. 5B. (Note that while FIG. 5 shows the tag compression applied to a fragment of an XML document file, the same compression may also be performed on a DTD file.)

Figure 6:
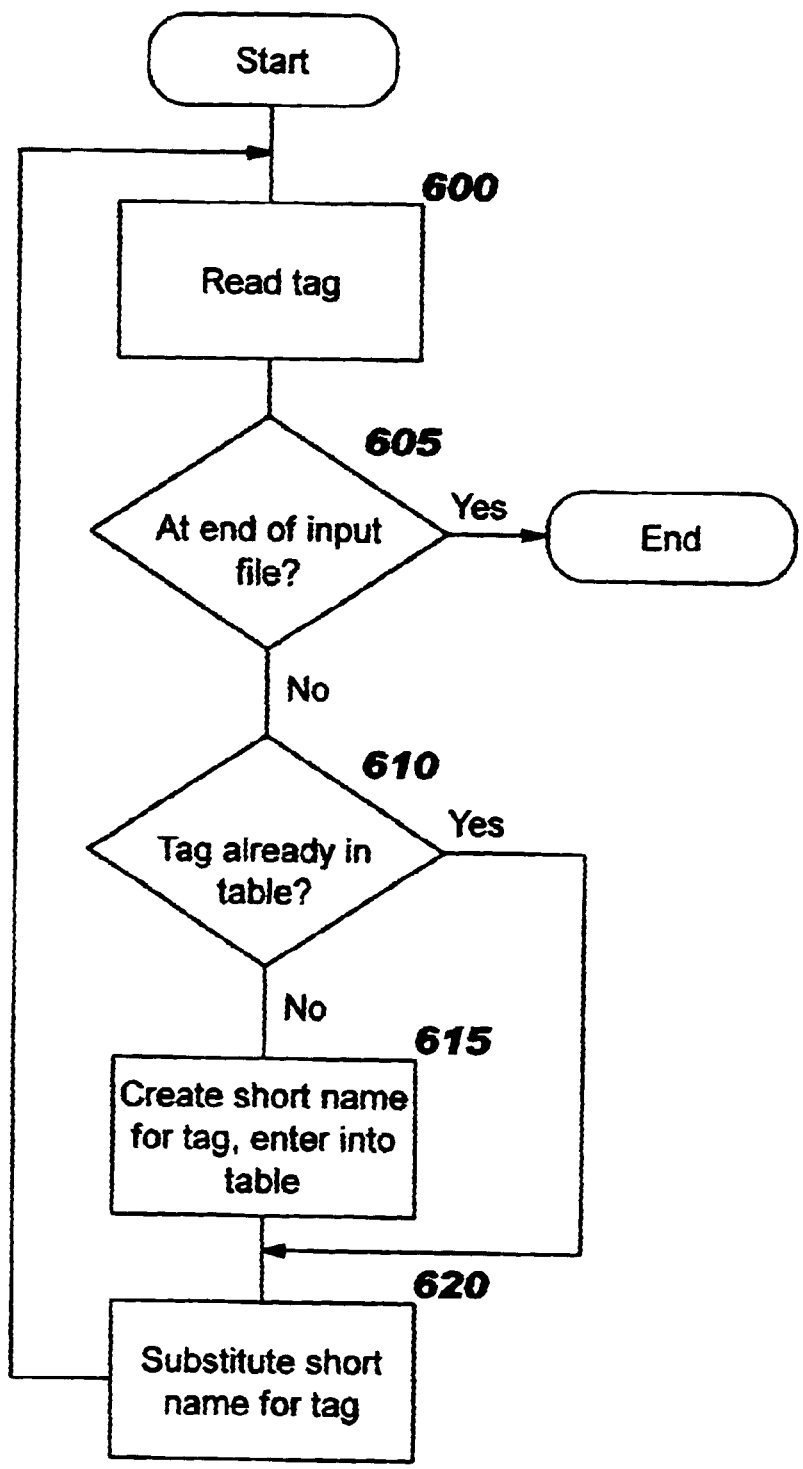
FIG. 6 illustrates a flow chart which sets forth the logic involved with a second and third aspect of the present invention.

FIG. 6 depicts a flowchart that may be used to implement the process with which this tag compression technique is performed, according to the preferred embodiment. The process begins at Block 600, where a tag is read from the input file. Block 605 asks if this is the end of the file. If so, then the tag compression is finished, and the process of FIG. 6 ends. Otherwise, Block 610 asks whether this tag is already in the tag table. For this aspect, a table is created that stores the original name of the tag, and a shorter compressed name that will be used for storing and/or transporting the file. When the tag located at Block 600 has already been entered into this table, control transfers to Block 620. Otherwise, in Block 615 a short name is created for the tag, and stored in the table along with the original tag name. Preferably, the same approach to generation of the short names is used for this aspect that was described above for the first aspect's generation of entity names. That is, the first tag will be represented by the letter "A", and so forth. This is shown in FIGS. 5A and 5B, where "Ship_To_Address" is the fifth tag encountered in this example and is therefore represented (560', 561', 570', 571') by the letter "E". When control reaches Block 620, there is an entry in the table for the current tag, so the short name is substituted into the input file in the place where the original tag was found. (Note that when an ending tag was read at Block 600, the test in Block 610 will always have a positive result, because the "/" character is considered part of the tag delimiter and not part of the tag name.) Control returns to Block 600 to read the next tag.

The file which has been compressed according to FIG. 6 can now be transferred between computers and/or stored in its compressed format. When the time comes to display or otherwise process the file, it must be decompressed. In order to perform the substitution of the original tags for the short names, restoring the file to its original contents, the table of short tag names and their corresponding original tag names must be available. That file will then be used in a process similar to that depicted in FIG. 6, but where the file being read is the compressed file; the tags being read at 600 are the short tag names; there will always be an entry for the short name in the file, so that the logic of Blocks 610 and 615 may be omitted; and the processing of Block 620 comprises substituting the original name for the short name. It will be obvious to one of ordinary skill in the art how FIG. 6 is to be changed to perform this complementary decompression technique, using these listed differences.

In a third aspect, the attributes within the tags within a file are compressed. As with the tag compression of the second aspect, this tag attribute compression may be applied to the XML document file, to the DTD file used with the document file, or to both files; it may also be used advantageously with document files encoded in other notations derived from SGML, not just with XML; it requires a complementary decompression process to be performed; and all tag attributes are compressed without special treatment for exception cases.

Figure 7B:
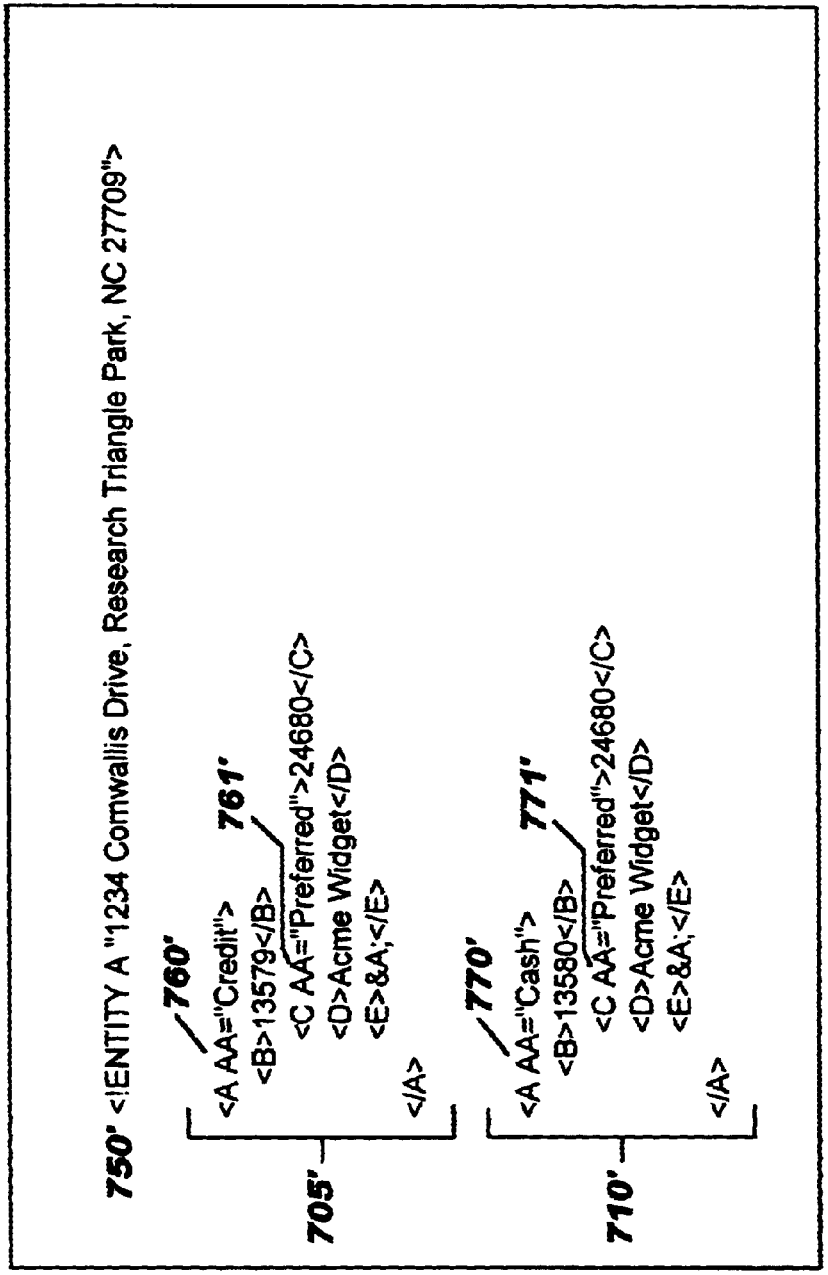

Attributes may optionally appear within tags, according to the XML syntax (and the SGML syntax from which XML is derived). FIGS. 7A and 7B show the same hypothetical customer order used in FIGS. 3 and 5. Again, this example builds on the previous techniques, so that FIG. 7A shows a file that has had tag compression and string compression already performed according to the first and second aspects of the present invention—although tag attribute compression may also be used advantageously without the other compression techniques. The file in FIG. 7A has not yet had tag attribute compression performed, while the file in FIG. 7B shows the result of performing this technique. The syntax of the original example has been changed somewhat in FIG. 7A, to introduce attributes within two of the tags. In the first order 705, an attribute having the name "Type" is shown at 760 for the "Order" tag, and again at 770 for the second order 710. According to this example, orders may have a type, which is "Credit" in order 705 and "Cash" in order 710. This example also illustrates that one tag attribute name may be used with more than one tag name, as shown at 761 and 771. Here, the attribute name "Type" is also used with the "Customer_Number" attribute, to indicate a customer type that may have been assigned. The type shown in the example is "Preferred". The short name that has already been assigned for "Type" is reused for this occurrence of "Type", as shown at 761' and 771'. In this example, the short name "AA" has been used, where two letters are used in the example to easily distinguish the tag attributes from the tags for illustrative purposes. However, other techniques for generating short names may also be used. For example, the assignment of the short names for both tag attributes and tags may be interleaved, in which case the tag attribute would become "B" instead of "AA", and the subsequent tags would then be assigned short names "C" through "F" instead of "B" through "E".

The logic with which this third aspect of compression can be performed is identical to that used in FIG. 6, except that tag attributes are being processed instead of tags. It will be obvious to one of ordinary skill in the art how FIG. 6 can be modified to implement tag attribute compression, and this technique will therefore not be described in detail. A complementary decompression process is required, and can be constructed as described with reference to FIG. 6. The table of short names and original tag attribute names must also be available for processing during decompression. It may be stored and/or transmitted along with the compressed file, or it may be transmitted upon request at the time when decompression of an already-received compressed file is to be performed.

When tag compression and tag attribute compression are both being performed, both types of compression will preferably be performed at the same time, according to the preferred embodiment of the present invention. Alternatively, one pass for each type of compression could be performed, as long as the second pass did not re-use the short names created by the first pass. Performing both at once has the advantage of creating only a single table, as opposed to the two tables that would be created if using two separate compression passes. It also has the advantage that names can be assigned (in sequential order, when using the approach described above), without regard to whether the original name is a tag or a tag attribute, so that no special treatment is required to avoid duplicate short name assignment.

While the preferred embodiment of the present invention has been described, additional variations and modifications in that embodiment may occur to those skilled in the art once they learn of the basic inventive concepts. The techniques disclosed herein are based partially upon certain predefined characteristics of the notations being processed. In particular, the formula used for string compression is based upon entity declarations and references that have a specific format. It will be obvious to one of ordinary skill in the art that the inventive concepts disclosed herein may be adapted to changes in the notations, should they occur. Therefore, it is intended that the appended claims shall be construed to include both the preferred embodiment and all such variations and modifications as fall within the spirit and scope of the invention.

We claim:

1. In a computing environment, computer readable code readable by a computer system in said environment, for reducing document file size by string compression, comprising:

a subprocess for reading an input file containing a structured document encoded in a derivative of Standard Generalized Markup Language (SGML) to locate each of a plurality of strings in said structured document, wherein said strings appear between tags in said structured document;

a subprocess for programmatically generating a unique entity name reference corresponding to each unique one of said located strings and substituting said corresponding programmatically-generated entity name reference for said located string, thereby creating a compressed version of said input file, provided that a first cost of substituting said entity name reference is less than a second cost of using said located string without substitution, and provided that said located string contains no embedded entity references; and a subprocess for programmatically creating an entity declaration and inserting said programmatically-created entity declaration into said compressed version of said input file for each of said unique entity name references, said entity declaration declaring said correspondence between said located string and said corresponding entity name reference, wherein entity declarations and entity name references are standard features of said derivative, and said inserted entity declarations and said substituted entity name references enable transparently recreating said structured document, by a standard parser for said derivative, using said compressed version of said input file.

2. Computer readable code for reducing document file size by string compression according to claim 1, wherein said derivative is Extensible Markup Language (XML).

3. Computer readable code for reducing document file size by string compression according to claim 1, further comprising a subprocess for transparently recreating said structured document by decompressing said compressed version of said input file using said standard parser for said derivative, wherein said standard parser automatically processes each of said entity declarations that were inserted into said compressed version, and wherein said automatic processing of each entity declaration further comprises:

locating, in said compressed version, each occurrence of said entity name reference declared by said entity declaration; and automatically substituting, for each of said located entity name references, said corresponding located string declared by said entity declaration.

4. A system for reducing document file size by string compression in a computing environment, comprising:

means for reading an input file containing a structured document encoded in a derivative of Standard Generalized Markup Language (SGML) to locate each of a plurality of strings in said structured document, wherein said strings appear between tags in said structured document;

means for programmatically generating a unique entity name reference corresponding to each unique one of said located strings and substituting said corresponding programmatically-generated entity name reference for said located string, thereby creating a compressed version of said input file, provided that a first cost of substituting said entity name reference is less than a second cost of using said located string without substitution, and provided that said located string contains no embedded entity references; and means for programmatically creating an entity declaration and inserting said programmatically-created entity declaration into said compressed version of said input file for each of said unique entity name references, said entity declaration declaring said correspondence between said located string and said corresponding entity name reference, wherein entity declarations and entity name references are standard features of said derivative, and said inserted entity declarations and said substituted entity name references enable transparently recreating, by a standard parser for said derivative, said structured document using said compressed version of said input file.

5. The system for reducing document file size by string compression according to claim 4, wherein said derivative is Extensible Markup Language (XML).

6. The system for reducing document file size by string compression according to claim 4, further comprising means for transparently recreating said structured document by decompressing said compressed version of said input file using said standard parser for said derivative, wherein said standard parser automatically processes each of said entity declarations that were inserted into said compressed versions, and wherein said automatic processing of each entity declaration further comprises:

locating, in said compressed version, each occurrence of said entity name reference declared by said entity declaration; and automatically substituting, for each of said located entity name references, said corresponding located string declared by said entity declaration.

7. A method for reducing document file size by string compression in a computing environment, comprising the steps of:

reading an input file containing a structured document encoded in a derivative of Standard Generalized Markup Language (SGML) to locate each of a plurality of strings in said structured document, wherein said strings appear between tags in said structured document;

programmatically generating a unique entity name reference corresponding to each unique one of said located strings and substituting said corresponding programmatically-generated entity name reference for said located string, thereby creating a compressed version of said input file, provided that a first cost of substituting said entity name reference is less than a second cost of using said located string without substitution, and provided that said located string contains no embedded entity references; and programmatically creating an entity declaration and inserting said programmatically-created entity declaration into said compressed version of said input file for each of said unique entity name references, said entity declaration declaring said correspondence between said located string and said corresponding entity name reference, wherein entity declarations and entity name references are standard features of said derivative, and said inserted entity declarations and said substituted entity name references enable transparently recreating said structured document, by a standard parser for said derivative, using said compressed version of said input file.

8. The method for reducing document file size by string compression according to claim 7, wherein said derivative is Extensible Markup Language (XML).

9. The method for reducing document file size by string compression according to claim 7, further comprising the step of transparently recreating said structured document by decompressing said compressed version of said input file using said standard passer for said derivative, wherein said standard parser automatically processes each of said entity declarations that were inserted into said compressed version, and wherein said automatic processing of each entity declaration further comprises steps of:

locating, in said compressed version, each occurrence of said entity name reference declared by said entity declaration; and automatically substituting, for each of said located entity name references, said corresponding located string declared by said entity declaration.

* * * * *

UNITED STATES PATENT AND TRADEMARK OFFICE
CERTIFICATE OF CORRECTION

PATENT NO. : 6,635,088 B1  Page 1 of 1
DATED : October 21, 2003
INVENTOR(S) : John Raithel Hind and David Bruce Lection It is certified that error appears in the above-identified patent and that said Letters Patent is hereby corrected as shown below:

<u>Title page,</u>
Item [54], Title, should read -- COMPRESSION AND DECOMPRESSION OF MARKUP FILES THROUGH XML ENTITY DECLARATIONS AND REFERENCES --

Signed and Sealed this

Thirtieth Day of March, 2004

JON W. DUDAS
*Acting Director of the United States Patent and Trademark Office*